United States Patent
Lin et al.

(10) Patent No.: US 10,277,117 B2
(45) Date of Patent: Apr. 30, 2019

(54) DEVICE WITH A VOLTAGE MULTIPLIER

(71) Applicant: Taiwan Semiconductor Manufacturing Company Limited, Hsinchu (TW)

(72) Inventors: Yu-Tso Lin, New Taipei (TW); Chih-Hsien Chang, Taipei (TW); Min-Shueh Yuan, Taipei (TW); Robert Bogdan Staszewski, Dulin (IE); Seyednaser Pourmousavian, Dublin (IE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/602,252

(22) Filed: May 23, 2017

(65) Prior Publication Data
US 2018/0342948 A1   Nov. 29, 2018

(51) Int. Cl.
| | |
|---|---|
| *H03L 5/00* | (2006.01) |
| *H02M 3/07* | (2006.01) |
| *H01L 29/94* | (2006.01) |
| *H03K 19/0185* | (2006.01) |

(52) U.S. Cl.
CPC .............. *H02M 3/07* (2013.01); *H01L 29/94* (2013.01); *H03K 19/018521* (2013.01)

(58) Field of Classification Search
None
See application file for complete search history.

(56) References Cited

U.S. PATENT DOCUMENTS

| | | | | |
|---|---|---|---|---|
| 5,912,574 A  * | 6/1999 | Bhagwan | ............... | H03K 3/017 327/157 |
| 6,828,850 B2 * | 12/2004 | LeChevalier | ........ | G09G 3/3216 327/536 |
| 7,042,275 B2 * | 5/2006 | Suwa | .................... | H02M 3/073 327/536 |
| 8,779,850 B2 * | 7/2014 | Wu | .................. | H03K 19/01735 327/589 |
| 8,994,402 B2 * | 3/2015 | Hwang | .......... | H03K 19/018507 326/80 |
| 9,077,190 B2 * | 7/2015 | Posat | ................. | H03K 17/0822 |
| 2003/0137341 A1* | 7/2003 | LeChevalier | ........ | G09G 3/3216 327/536 |
| 2009/0174441 A1* | 7/2009 | Gebara | ................. | H02M 3/073 327/115 |
| 2009/0295362 A1* | 12/2009 | Douts | .................... | G11C 5/145 323/351 |
| 2010/0002478 A1* | 1/2010 | Hwang | ................... | H02M 3/07 363/60 |
| 2011/0163797 A1* | 7/2011 | Posat | ................. | H03K 17/0822 327/537 |

(Continued)

*Primary Examiner* — Lincoln D Donovan
*Assistant Examiner* — Khareem E Almo
(74) *Attorney, Agent, or Firm* — Jones Day

(57) ABSTRACT

A device includes a level shifter and a voltage multiplier. The level shifter is responsive to a first clock signal configured to shift the first clock signal to a second clock signal at a higher level than the first clock signal based on a node voltage. The voltage multiplier is responsive to the second clock signal for generating the node voltage. The node voltage is output from the voltage multiplier for driving a load and is further fed back to the level shifter for generating the second clock signal.

19 Claims, 7 Drawing Sheets

(56) References Cited

U.S. PATENT DOCUMENTS

| | | | |
|---|---|---|---|
| 2013/0321056 A1* | 12/2013 | Wu | H03K 3/013 |
| | | | 327/313 |
| 2017/0279349 A1* | 9/2017 | Nork | H02M 3/07 |
| 2017/0338823 A1* | 11/2017 | Reinhold | G01R 19/16585 |

* cited by examiner

DEVICE WITH A VOLTAGE MULTIPLIER

BACKGROUND

A device uses a voltage multiplier to generate a voltage greater than, e.g., twice, a supply voltage. For example, a device, such as a memory device, may read a memory cell at a read voltage equal to the supply voltage and write to the memory cell at a write voltage twice the supply voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
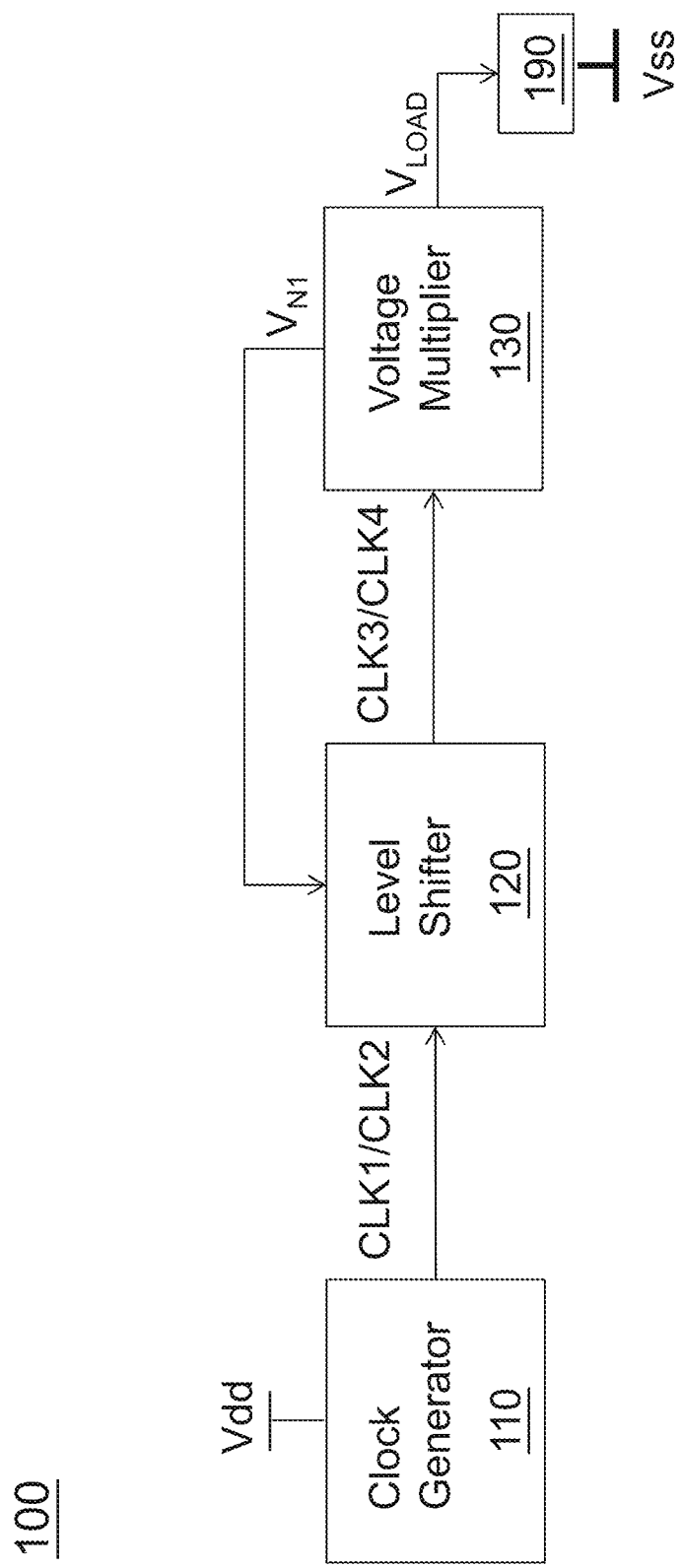
FIG. 1 is a schematic block diagram illustrating an exemplary device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods described herein include a device, such as a memory device, that operates in multiple voltage domains. For example, a memory device may read a memory cell at a read voltage equal to a nominal supply voltage while writing to the memory cell at a write voltage that is about twice the nominal supply voltage. In another example, the load is a time-to-digital converter (TDC) that converts time information into a digital code. For example, the TDC may output a series of 1's and 0's indicating levels of signals at a certain point in time. Such a circuit may be useful in an all-digital phase lock loop (ADPLL) system.

Unlike a conventional device that drives all loads at a nominal voltage, e.g., supply voltage, at which the conventional device operates, the present disclosure, in various embodiments, provides a device, e.g., device 100 of FIG. 1, configured to operate using a nominal voltage, e.g., about 0.4V, for some operations while driving a load at a load voltage greater than the nominal voltage, e.g., about 0.8V, for other operations. This makes the device 100 of the present disclosure suitable for operating at a low voltage in a nominal state, while providing a substantially constant high voltage for functionality when necessary.

In further detail, FIG. 1 is a schematic block diagram illustrating an exemplary device 100 in accordance with some embodiments. The example device 100, e.g., an integrated circuit, is connected between a supply node and a reference node and includes a clock generator 110, a level shifter 120, and a voltage multiplier 130. The supply node is configured to receive a supply voltage (Vdd), e.g., 0.4V. The reference node is configured to receive a reference voltage (Vss) lower than the supply voltage (Vdd), e.g., 0V. The circuitry 110, 120, 130 depicted in FIG. 1 is configured to provide a substantially constant load voltage ($V_{LOAD}$), at a voltage higher than the supply voltage (Vdd) through timed interactions with a capacitive element, e.g., capacitive element (C1) in FIG. 3, using two level shifted signals.

The clock generator 110 is configured to operate at the supply voltage (Vdd), e.g., about 0.4V, and to generate first and second clock signals (CLK1, CLK2) based on the supply voltage (Vdd), which are provided to the level shifter 120. For example, the clock generator 110 includes first and second modules. The first module, e.g., a cross-coupled flip-flop, is configured to receive an input signal and to generate the first and second clock signals (CLK1, CLK2) that each correspond to the input signal and alternate between a low signal level, e.g., a reference voltage (Vss) level, and a high signal level, e.g., a supply voltage (Vdd) level. The second module is configured to introduce a delay, e.g., time (t1) in FIG. 2, between a falling/rising edge of the first clock signal (CLK1) and a rising/falling edge of the second clock signal (CLK2). In one implementation, the second module includes a pair of inverters connected in series.

The level shifter 120 is configured to generate third and fourth clock signals (CLK3, CLK4) at a shifted voltage (e.g., 0.8V). The level shifter 120 is able to achieve this voltage shifting despite being supplied by the first and second clock signals (CLK1, CLK2) at the nominal supply voltage through utilization of a feedback path, e.g., node (N1), from the voltage multiplier 130 as described in further detail below.

The voltage multiplier 130 is responsive to the third and fourth clock signals (CLK3, CLK4) from the level shifter 120 for generating a substantially constant load voltage ($V_{LOAD}$), e.g., about 0.8V, greater than the supply voltage (Vdd) and for driving a load 190 using the timed, level shifter clock signals (CLK3, CLK4) from the level shifter 120. For example, the voltage multiplier 130, during a high third clock signal (CLK3) level, charges a capacitive element, e.g., capacitive element (C1) in FIG. 3, to the supply voltage (Vdd). Then, during a high fourth clock signal (CLK4) level, the voltage multiplier 130 connects the capacitive element in series with the supply voltage (Vdd) to produce an additive effect, resulting in the load voltage ($V_{LOAD}$) substantially twice the supply voltage (Vdd). This further results in a node voltage at the node (N1) substantially twice the supply voltage (Vdd) that is fed back to the level shifter 120 for generating the third and fourth clock signals (CLK3, CLK4).

As described below, efficiency of the voltage multiplier 130 can be improved via an increase in a capacitance of the capacitive element (C1), e.g., via capacitive element (C1) structure, without enlarging the capacitive element's (C1) physical size.

For further detail on the clock signals (CLK1, CLK2, CLK3, CLK4), FIGS. 2A-2D illustrate schematic timing diagrams of an exemplary relationship among the clock signals (CLK1, CLK2, CLK3, CLK4) in accordance with some embodiments. As illustrated in FIGS. 2A and 2B, each of the first and second clock signals (CLK1, CLK2) alternates between a low signal level, e.g., reference voltage (Vss) level, and a high signal level, e.g., supply voltage (Vdd) level. The high signal levels of the first clock signal (CLK1) and the high signal levels of the second clock signal (CLK2) do not overlap with each other in time. For example, there is a time (t1) between a falling/rising edge of the first clock signal (CLK1) and a rising/falling edge of the second clock signal (CLK2).

As illustrated in FIGS. 2C and 2D, each of the third and fourth clock signals (CLK3, CLK4) alternates between a low signal level, e.g., reference voltage (Vss) level, and a high signal level, e.g., two times the supply voltage (Vdd) level, higher than the high signal levels of the first and second clock signals (CLK1, CLK2), respectively. In the examples of FIGS. 2A-2D, the third/fourth clock signal (CLK3/CLK4) is substantially in phase with the first/second clock signal (CLK1/CLK2). Thus, similar to the first and second clock signals (CLK1, CLK2), the high signal levels of the third clock signal (CLK3) and the high signal levels of the fourth clock signal (CLK2) do not overlap with each other in time and there is a time (t2) between a falling/rising edge of the third clock signal (CLK3) and a rising/falling edge of the fourth clock signal (CLK4) substantially equal to the time (t1). In an alternative embodiment, the third/fourth clock signal (CLK3/CLK4) is 180° out of phase with the first/second clock signal (CLK1/CLK2).

As will be apparent from the discussion which follows, the time (t1) is determined to ensure that the time (t2) duration, e.g., about 0.5 µs, is long enough so that falling/rising edges of the third clock signal (CLK3) and rising/falling edges of the fourth clock signal (CLK4) do not overlap, preventing short-circuiting of the supply node and the reference node. The time (t1) is further determined to ensure that the time (t2) duration is short enough so that the load 190 is driven at a substantially constant load voltage ($V_{LOAD}$) by the voltage multiplier 130.

Figure 3:
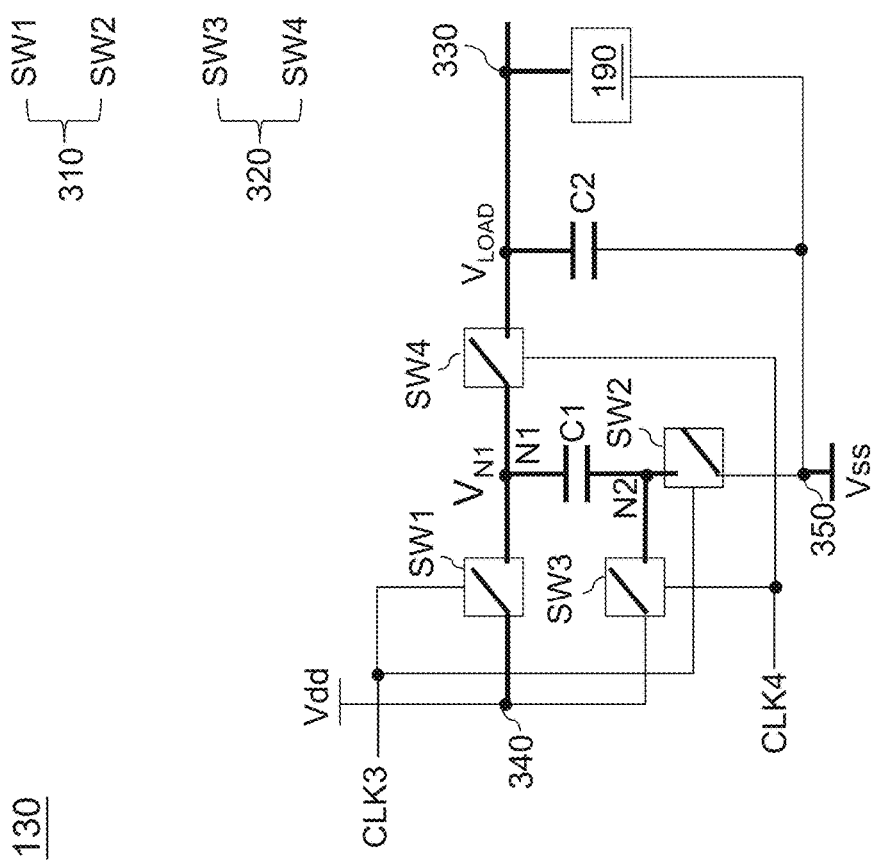
FIG. 3 is a schematic circuit diagram illustrating an exemplary voltage multiplier in accordance with some embodiments.

In some embodiments, the voltage multiplier 130 is responsive to the third and fourth clock signals (CLK3, CLK4) for generating a voltage greater than the supply voltage (Vdd). FIG. 3 is a schematic circuit diagram illustrating an exemplary voltage multiplier 130 in accordance with some embodiments. The example voltage multiplier 130 includes first and second nodes (N1, N2), first and second capacitive elements (C1, C2), first and second switch units 310, 320, and a load node 330.

The first capacitive element (C1) is connected between the first and second nodes (N1, N2). The first switch unit 310 includes first and second switches (SW1, SW2) and is configured to receive the third clock signal (CLK3). The first switch (SW1) is connected between a supply node 340 and the first node (N1) and is configured to selectively connect the first node (N1) to the supply node 340 in response to the third clock signal (CLK3). The second switch (SW2) is connected between the second node (N2) and a reference node 350 and is configured to selectively connect and disconnect the second node (N2) to and from the reference node 350 in response to the third clock signal (CLK3).

The second switch unit 320 includes third and fourth switches (SW3, SW4) and is configured to receive the fourth clock signal (CLK4). The third switch (SW3) is connected between the supply node 340 and the second node (N2) and is configured to selectively connect and disconnect the second node (N2) to and from the supply node 340 in response to the fourth clock signal (CLK4). The fourth switch (SW4) is connected between the first node (N1) and the load node 330 and is configured to selectively connect and disconnect the first node (N1) to and from the load node 330 in response to the fourth clock signal (CLK4). In this embodiment, the switches (SW1-SW4) are n-type FETs. In some embodiments, at least one of the switches (SW1-SW4) is a p-type FET. In other embodiments, at least one of the switches (SW1-SW4) is any type of transistor, e.g., a bipolar junction transistor (BJT), or other type of switch.

The second capacitive element (C2), e.g., a metal-oxide semiconductor capacitor (MOSCAP), a metal-insulator-metal (MIM) capacitor, other type of capacitor, or a combination thereof, is connected between the load node 330 and the reference node 350. In some embodiments, the device 100 includes the load 190. In other embodiments, the device 100 does not include the load 190 and the load 190 may be connected between the load node 330 and the reference node 350 externally of the device 100.

From an experimental result, at a given current, e.g., 400 µA, flowing through the load 190, the device 100 provides a substantially constant load voltage (Vload), e.g., about 91% to about 99% of two times the supply voltage (Vdd) and a relatively small ripple voltage, e.g., about 20 mV to about 30 mV. Further, the device 100 outputs the substantially constant load voltage (Vload) within a short period of time, e.g., about 1 µs after the device 100 receives the supply voltage (Vdd).

Figures 4A, 4B:
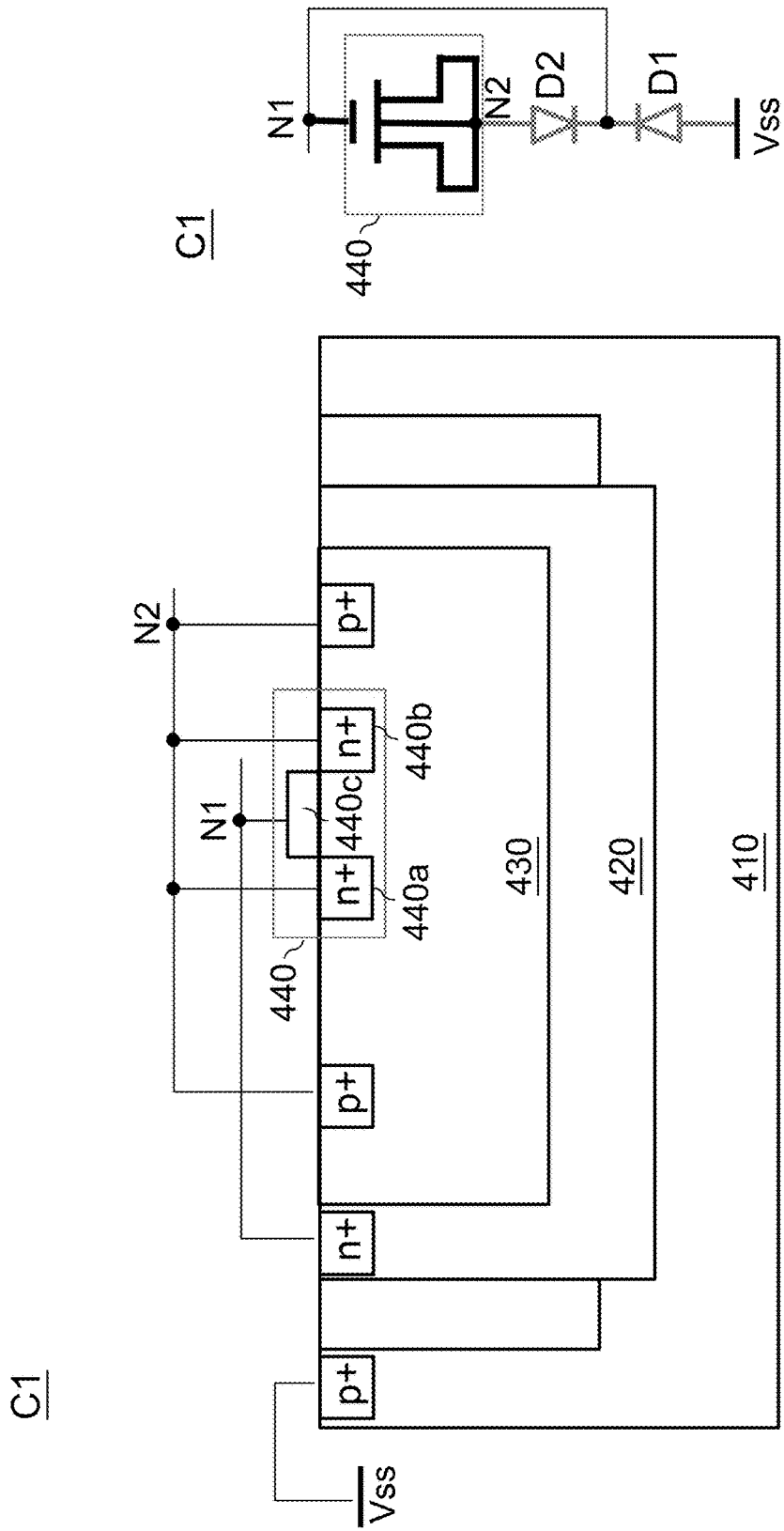
FIG. 4A is a schematic sectional view illustrating an exemplary capacitive element in accordance with some embodiments.
FIG. 4B is a schematic circuit diagram illustrating an exemplary capacitive element in accordance with some embodiments.

In some embodiments, the first capacitive element (C1) has a structure that increases its capacitance, without enlarging its physical size, improving efficiency of the voltage multiplier 130. For example, FIG. 4A is a schematic sectional view illustrating an exemplary first capacitive element (C1) in accordance with some embodiments. The first capacitive element (C1) includes a substrate 410, first and second well regions 420, 430, and a transistor 440. The substrate 410 has a p-type conductivity and is connected to the reference node 350 (see FIG. 3). The substrate 410 may be a bulk substrate, a semiconductor-on-insulator (SOI) substrate, or a combination thereof. Examples of materials for the substrate 410 include, but are not limited to, silicon, germanium, any suitable semiconductor material, or a combination thereof.

The first well region 420 is formed, such as by implantation, in a portion of the substrate 410. The first well region 420 may include the same material as the substrate 410, but is doped with n-type impurities and thus have an n-type conductivity. FIG. 4B is a schematic circuit diagram illustrating an exemplary first capacitive element (C1) in accordance with some embodiments. As can be seen from FIG. 4B, because the substrate 410 and the first well region 420 have different conductivity types, the substrate 410 and the first well region 420 cooperatively form a diode (D1). The second well region 430 is implanted in a portion of the first well region 420, includes the same material as the substrate 410, has a p-type conductivity, and is connected to the second node (N2). The first well region 420 extends deeper into the substrate 410 than the second well region 430. As can be seen from FIG. 4B, because the first well region 420 and the second well region 430 have different conductivity types, the first well region 420 and the second well region 430 cooperatively form a diode (D2) connected to the diode (D1).

The transistor 440 is over at the second well region 430 and includes source and drain regions 440a, 440b that has an n-type conductivity and that are implanted in the second well region 430 and a gate region 440c that is over a channel region between the source and drain regions 440a, 440b. As can be seen from FIG. 4B, because the source and drain regions 440a, 440b are connected to each other and to the second node (N2), a capacitor is formed by the transistor 440. The second well region 430 is connected to the second node (N2) so as not to leave the second well region 430 floating. The first well region 420 and the gate region 440c are connected to each other and to the first node (N1) (See FIG. 3). This results in an increased capacitance for the capacitive element (C1), e.g., about 10% from a capacitance thereof when the first well region 420 and the gate region 440c are disconnected from each other, improving an efficiency of the device 100, for as much as 12%.

Figure 5:
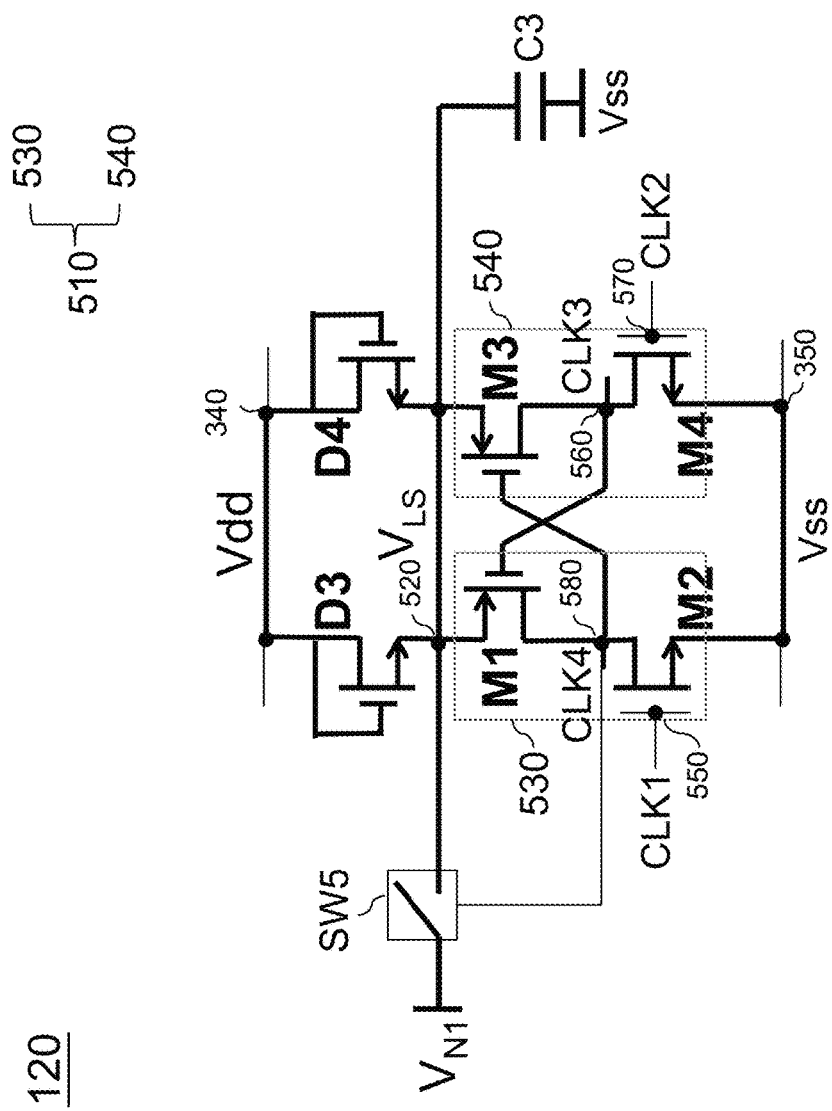
FIG. 5 is a schematic circuit diagram illustrating an exemplary level shifter in accordance with some embodiments.

In some embodiments, the level shifter 120 is responsive to the first and second clock signals (CLK1, CLK2) configured to shift the first and second clock signals (CLK1, CLK2) to the third and fourth clock signals (CLK3, CLK4), respectively, at higher levels than the first and second clock signals (CLK1, CLK2) based on a node voltage ($V_{N1}$) (see FIG. 3) generated by the voltage multiplier 130. FIG. 5 is a schematic circuit diagram illustrating an exemplary level shifter 120 in accordance with some embodiments. The example level shifter 120 includes a pair of switches (D3, D4), a third switch unit 510, a third capacitive element (C3), and a fifth switch (SW5). Each of the switches (D3, D4) is connected between the supply node 340 and a level shift node 520. In some embodiments, each of the switches (D3, D4) includes one or more diodes. In the example of FIG. 5, each of the switches (D3, D4) includes a diode in the form of a diode-connected FET.

The third switch unit 510 includes a pair of cross-coupled inverters 530, 540. The inverter 530 includes first and second transistors (M1, M2) connected between the level shift node 520 and the reference node 350. Similarly, the inverter 540 includes third and fourth transistors (M3, M4) connected between the level shift node 520 and the reference node 350. In the example of FIG. 5, the first and third transistors (M1, M3) are p-type FETs, whereas the second and fourth transistors (M2, M4) are n-type FETs. A first input node 550 is connected to the second transistor (M2). A first output node 560 is connected between the third and fourth transistors (M3, M4). A second input node 570 is connected to the fourth transistor (M4). A second output node 580 is connected between the first and second transistors (M1, M2).

The third capacitive element (C3), e.g., a MOSCAP, a MIM capacitor, other type of capacitor, or a combination thereof, is connected between the shift level node 520 and the reference node 350.

The fifth switch (SW5) is connected to the first node (N1) (see FIG. 3), the level shift node 520, and the second output node 580. As described below, the fifth switch (SW5) is responsive to the fourth clock signal (CLK4) for periodically connecting the level shift node 520 to the first node (N1). In this embodiment, the fifth switch (SW5) is an n-type FET. In some embodiments, the fifth switch (SW5) is a p-type FET. In other embodiments, the fifth switch (SW5) is any type of transistor, e.g., a BJT, or other type of switch. The above-described level shifter 120 circuit is provided by way of example and other suitable level shifter 120 circuits are within the scope of the present disclosure.

Figures 6, 7:
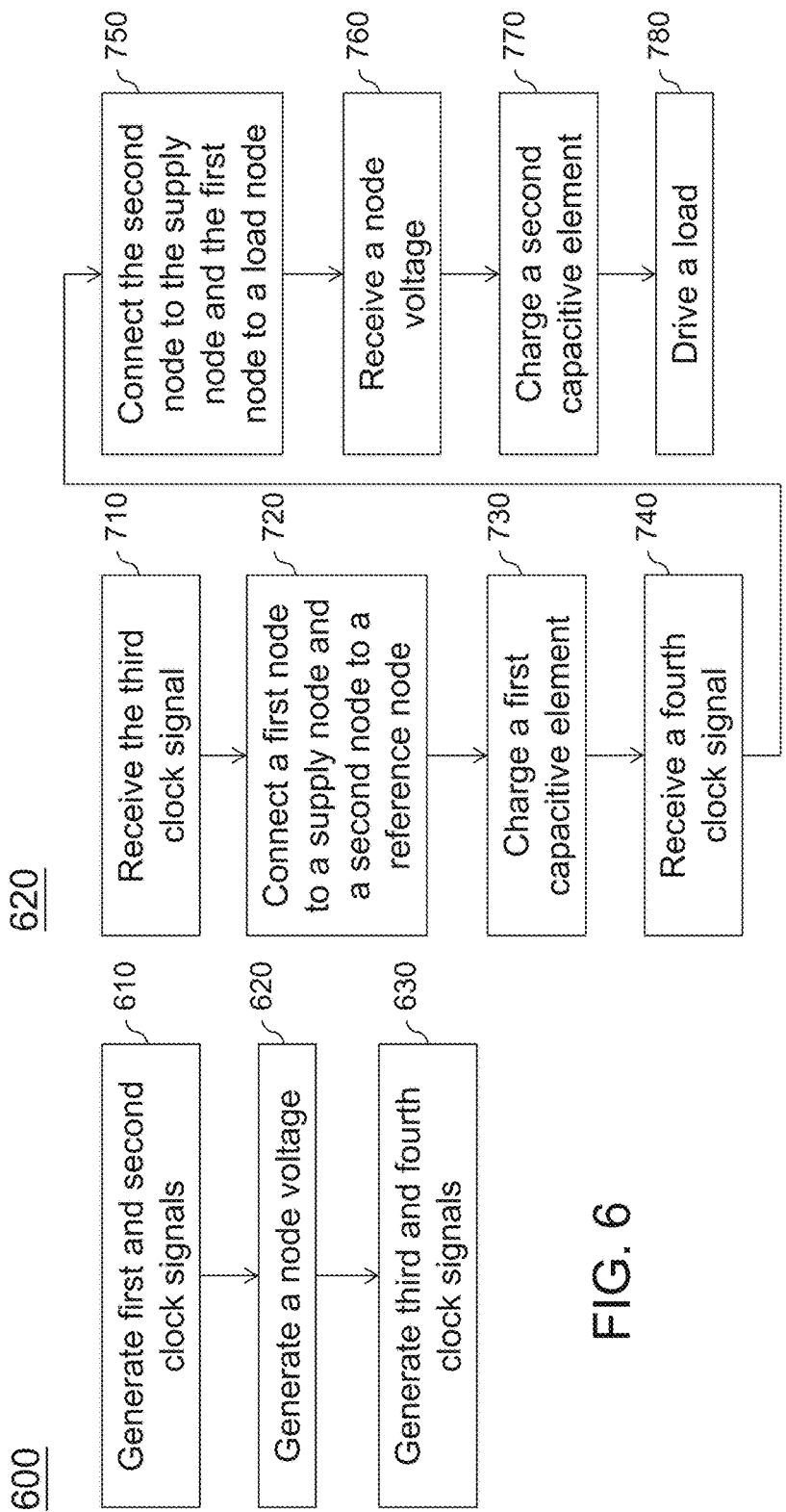
FIG. 6 is a flow chart illustrating an exemplary method of operation of a voltage multiplier in accordance with some embodiments.
FIG. 7 is a flow chart illustrating an exemplary operation of a method in accordance with some embodiments.

FIG. 6 is a flow chart illustrating an exemplary method 600 of operation of a voltage multiplier 130 in accordance with some embodiments. The example method 600 is described with further reference to FIGS. 1, 3, and 5 for ease of understanding. It should be understood that the method 600 is applicable to structures other than those of FIGS. 1, 3 and 5. Further, method 600 is not limited to operations discussed hereinafter. Rather, operations may be added/removed, the order of the operations may be changed, operations may be combined/split, and/or operations may be modified without departing from the scope of the present disclosure. In operation 610, the clock generator 110 generates first and second clock signals, e.g., first and second clock signals (CLK1, CLK2) in FIG. 2, based on the supply voltage (Vdd), e.g., 0.4V.

Figure 2:
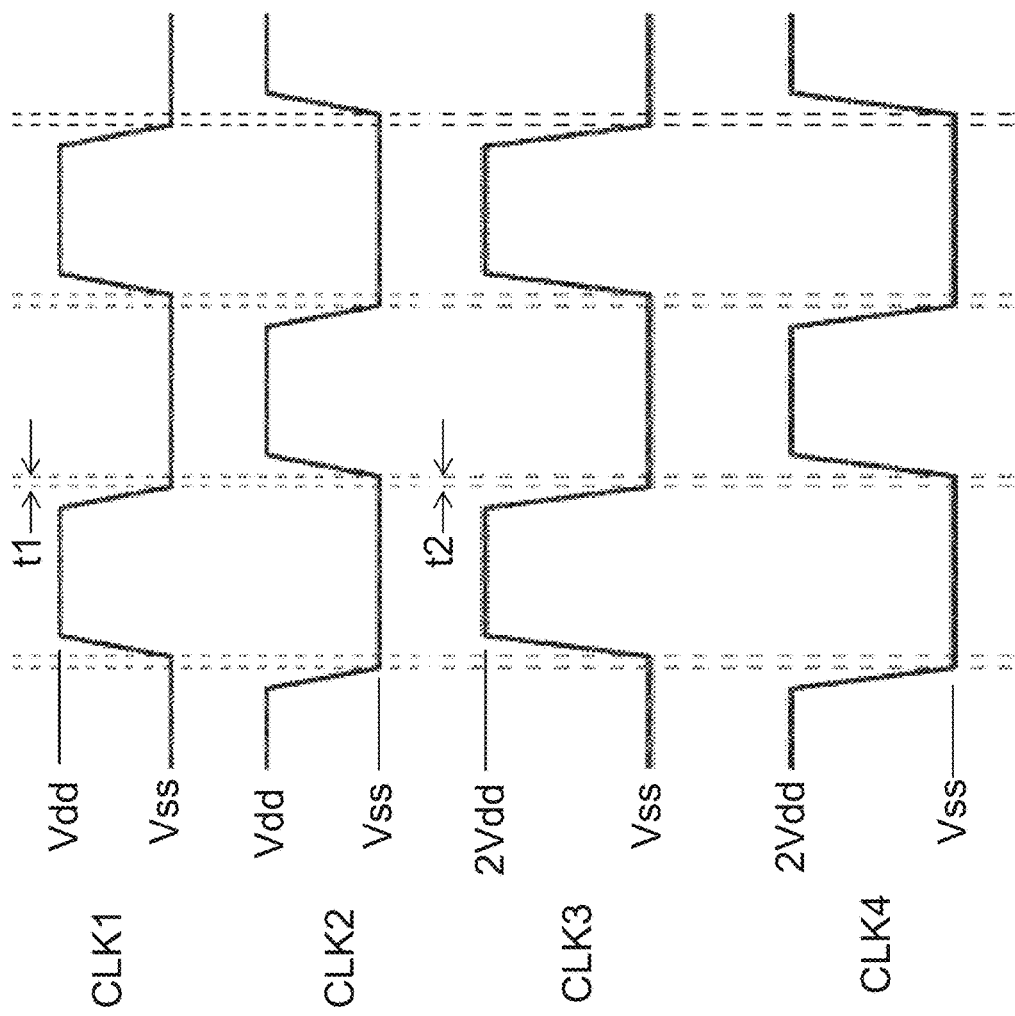
FIGS. 2A-2D are schematic timing diagrams illustrating an exemplary relationship among clock signals in accordance with some embodiments.

In operation 620, the voltage multiplier 130 generates a node voltage ($V_{N1}$) greater than the supply voltage (Vdd) in response to third and fourth clock signals, e.g., third and fourth clock signals (CLK3, CLK4) in FIG. 2. FIG. 7 is a flow chart illustrating an exemplary operation 620 of method 600 in accordance with some embodiments. In operation 710, the first switch unit 310 receives the third clock signal (CLK3) that transitions from a low signal level to a high signal level and, thus, in operation 720, the first switch (SW1) connects the first node (N1) to the supply node 340 and the second switch (SW2) connects the second node (N2) to the reference node 350, whereby, in operation 730, the first capacitive element (C1) is charged to the supply voltage (Vdd). At this time, the second switch unit 320 receives a low fourth clock signal (CLK4) level and, thus the third switch (SW3) disconnects the second node (N2) from the supply node 340 and the fourth switch (SW4) disconnects the first node (N1) from the load node 330.

Next, the first switch unit 310 receives the third clock signal (CLK3) that transitions from the high signal level back to the low signal level and, thus the first switch (SW1) disconnects the first node (N1) from the supply node 340 and the second switch (SW2) disconnects the second node (N2) from the reference node 350.

After a certain time, e.g., time (t1) of about 0.5 ns, in operation 740, the second switch unit 320 receives the fourth clock signal (CLK4) that transitions from the low signal level to the high signal level and, thus, in operation 750, the third switch (SW3) connects the second node (N2) to the supply node 340 and the fourth switch (SW4) connects the first node (N1) to the load node 330, whereby, in operation 760, the first node (N1) receives a node voltage ($V_{N1}$), e.g., about 0.8V, substantially equal to the sum of the supply voltage (Vdd) at the supply node 340 and a charged voltage across the first capacitive element (C1). Then, in operation 770, the second capacitive element (C2) is charged to a load voltage (Vload), e.g., about 0.8V, substantially equal to the node voltage ($V_{N1}$). As a result, in operation 780, the voltage multiplier 130 drives the load 190 at the load voltage (Vload) greater than, e.g., about twice, the supply voltage (Vdd).

Figure 8:
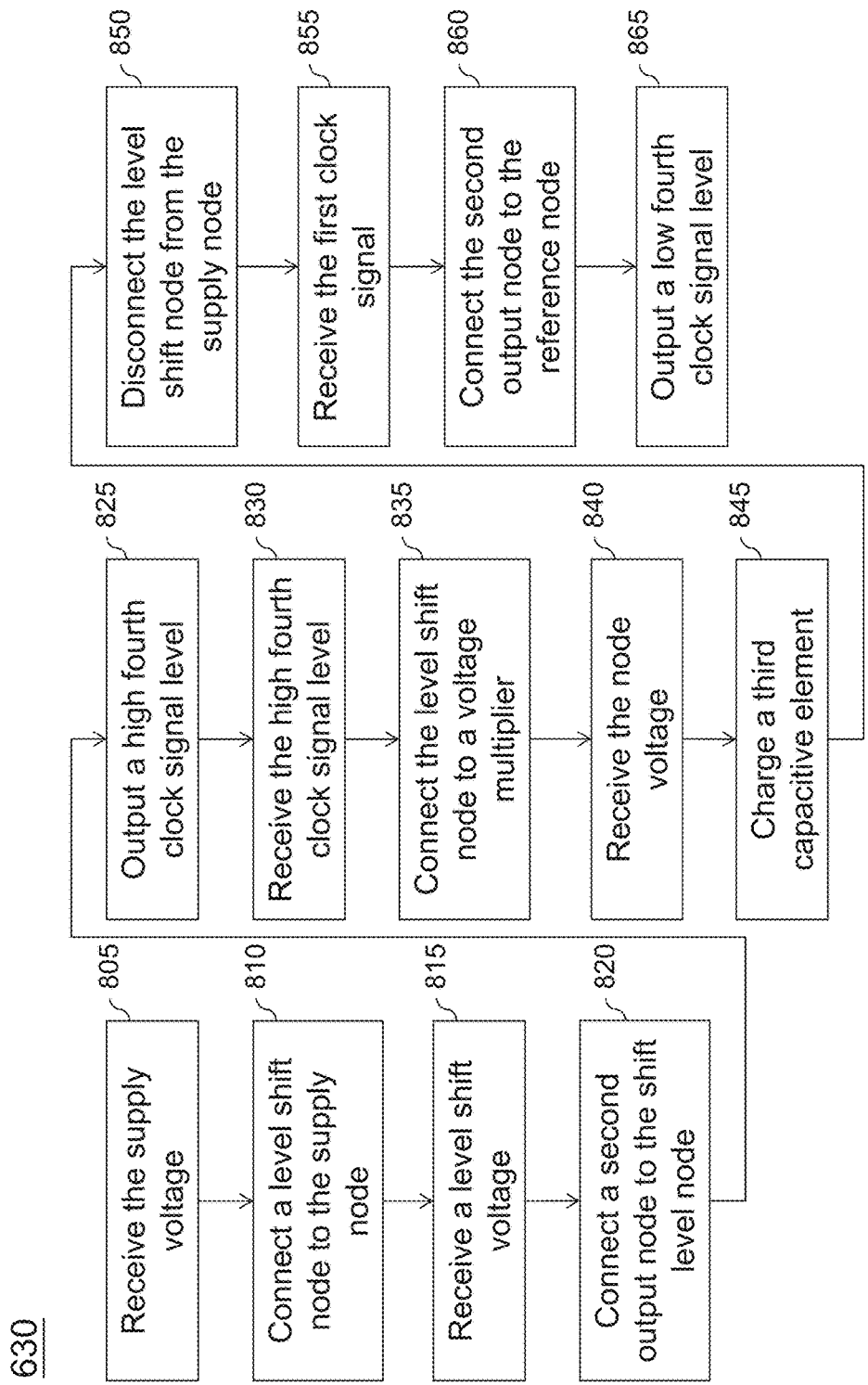
FIG. 8 is a flow chart illustrating an exemplary operation of a method in accordance with some embodiments.

Referring back to FIG. 6, in operation 630, the level shifter 120 shifts the first and second clock signals (CLK1, CLK2) to the third and fourth clock signals (CLK3, CLK4), respectively, at higher levels than the first and second clock signals (CLK1, CLK2) based on the node voltage ($V_{N1}$). FIG. 8 is a flow chart illustrating an exemplary operation 630 of method 600 in accordance with some embodiments. In operation 805, the supply node 340 receives the supply voltage (Vdd). This forward-biases the switches (D3, D4) and, thus, in operation 810, the switches (D3, D4) connect the shift level node 520 to the supply node 340, whereby, in operation 815, the level shift node 520 receives a level shift voltage ($V_{LS}$) less than the supply voltage (Vdd), i.e., substantially equal to the difference between the supply voltage (Vdd) and a voltage drop across the switches (D3, D4).

Then, the second input node 570 receives the second clock signal (CLK2) that transitions from the low signal level to the high signal level. This activates the fourth transistor (M4) and, thus the fourth transistor (M4) connects the first output node 560 to the reference node 350, whereby the first output node 560 outputs a low third clock signal (CLK3) level. This, in turn, activates the first transistor (M1), and, thus, in operation 820, the first transistor (M1) connects the second output node 580 to the level shift node 520, whereby, in operation 825, the second output node 580 outputs a high fourth clock signal (CLK4) level.

Next, in operation 830, the fifth switch (SW5) receives the high fourth clock signal (CLK4) level and, thus, in operation 835, the fifth switch (SW5) connects the level shift node 520 to the first node (N1), whereby, in operation 840, the level shift node 520 receives the node voltage ($V_{N1}$). This increases the level shift voltage ($V_{LS}$) to substantially equal to the node voltage ($V_{N1}$) and, thus, in operation 845, the third capacitive element (C3) is charged to the level shift voltage ($V_{LS}$). This, in turn, reverse-biases the switches (D3, D4) and, thus, in operation 850, the switches (D3, D4) disconnect the level shift node 520 from the supply node 340.

In a subsequent operation, the second input node 570 receives the second clock signal (CLK2) that transitions from the high signal level back to the low signal level. This deactivates the fourth transistor (M4) and, thus the fourth transistor (M4) disconnects the first output node 560 from the reference node 350.

After a certain time, e.g., time (t1), in operation 855, the first input node 550 receives a first clock signal (CLK1) that transitions from the low signal level to the high signal level. This activates the transistor (M2) and, thus, in operation 860, the second transistor (M2) connects the second output node 580 to the reference node 350, whereby, in operation 865, the second output node 580 outputs a low fourth clock signal (CLK4) level. This, in turn, activates the third transistor (M3) and, thus the third transistor (M3) connects the first output node 560 to the level shift node 520, whereby the first output node 560 outputs a high third clock signal (CLK3) level.

In an alternative embodiment, the level shifter 120 is configured to output the third clock signal (CLK3) from the second output node 580 and the fourth clock signal (CLK4) from the first output node 560. In such an alternative embodiment, the fifth switch (SW5) is connected to the first output node 560, instead of the second output node 580.

Referring back to FIG. 1, in some embodiments, the device 100 does not include one of the clock generator 110 and the voltage multiplier 130. In such some embodiments, the clock generator 100 or the voltage multiplier 130 may be connected to the level shifter 120 externally of the device 100.

In an embodiment, a device comprises a level shifter and a voltage multiplier. The level shifter is responsive to a first clock signal configured to shift the first clock signal to a second clock signal at a higher level than the first clock signal based on a node voltage. The voltage multiplier is responsive to the second clock signal for generating the node voltage. The node voltage is output from the voltage multiplier for driving a load and is further fed back to the level shifter for generating the second clock signal.

In another embodiment, a device comprises a clock generator and a level shifter. The clock generator is configured to receive a supply voltage and to generate a first clock signal based on the supply voltage. The level shifter is configured to receive a node voltage greater than the supply voltage and is responsive to the first clock signal configured to shift the first clock signal to a second clock signal at a higher level than the first clock signal based on the node voltage.

In another embodiment, a method comprises: generating a first clock signal based on a supply voltage; in response to a second clock signal, generating a node voltage greater than the supply voltage; shifting the first clock signal to the second clock signal at a higher level than the first clock signal based on the node voltage. Shifting the first clock signal to the second clock signal includes: receiving, at a level shift node, the node voltage; periodically coupling an output node to the level shift node in response to the first clock signal; and output the second clock signal from the output node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a level shifter responsive to a first clock signal configured to shift the first clock signal to a second clock signal at a higher level than the first clock signal based on a node voltage; and
    a voltage multiplier responsive to the second clock signal for generating the node voltage, wherein the node voltage is output from the voltage multiplier for driving a load and is further fed back to the level shifter for
generating the second clock signal,
wherein the voltage multiplier includes a first capacitive
element coupled between a first node and a second
node, the first capacitive element having:
a first well region;
a second well region formed in the first well region; and
a transistor including source and drain regions formed
in the second well region and coupled to each other
and to the second node and a gate region formed over
the second well region, wherein the first well region
and the gate region are coupled to each other and to
the first node.

2. The device of claim 1, wherein:
the level shifter includes a switch unit between a level
shift node and an output node;
the level shift node is configured to receive the node
voltage; and
the switch unit is responsive to the first clock signal for
periodically coupling the output node to the level shift
node.

3. The device of claim 2, wherein the switch unit is further
responsive to the first clock signal for periodically coupling
the output node to a reference node.

4. The device of claim 2, further comprising a second
switch unit responsive to the second clock signal for periodically coupling the level shift node to the voltage multiplier.

5. The device of claim 2, further comprising a second
switch unit coupled between the level shift node and a
supply node.

6. The device of claim 2, further comprising a second
capacitive element coupled between the level shift node and
a reference node.

7. The device of claim 1, further comprising a clock
generator configured to generate the first clock signal based
on a supply voltage.

8. A device comprising:
a clock generator configured to receive a supply voltage
and to generate a first clock signal based on the supply
voltage;
a level shifter configured to receive a node voltage greater
than the supply voltage and responsive to the first clock
signal configured to shift the first clock signal to a
second clock signal at a higher level than the first clock
signal based on the node voltage; and
a voltage multiplier responsive to the second clock signal,
wherein the voltage multiplier includes a first capacitive
element coupled between a first node and a second
node, the first capacitive element having:
a first well region;
a second well region formed in the first well region; and
a transistor including source and drain regions formed
in the second well region and coupled to each other
and to the second node and a gate region formed over
the second well region, wherein the first well region
and the gate region are coupled to each other and to
the first node.

9. The device of claim 8, wherein:
the level shifter includes a switch unit between a level
shift node and an output node;
the level shift node is configured to receive the node
voltage; and
the switch unit is responsive to the first clock signal for
periodically coupling the output node to the level shift
node.

10. The device of claim 9, wherein the switch unit is
further responsive to the first clock signal for periodically
coupling the output node to a reference node.

11. The device of claim 9, further comprising a second
switch unit coupled between the level shift node and a node
configured to receive the node voltage, wherein the second
switch unit is responsive to the second clock signal for
periodically coupling the level shift node to the node.

12. The device of claim 9, further comprising a second
switch unit coupled between the level shift node and a
supply node.

13. The device of claim 9, further comprising a second
capacitive element coupled between the level shift node and
a reference node.

14. A method comprising:
generating a first clock signal based on a supply voltage;
in response to a second clock signal, generating a node
voltage greater than the supply voltage; and
shifting the first clock signal to the second clock signal at
a higher level than the first clock signal based on the
node voltage, wherein shifting the first clock signal to
the second clock signal includes
receiving, at a level shift node, the node voltage,
periodically coupling an output node to the level shift
node in response to the first clock signal, and
output the second clock signal from the output node,
wherein generating the node voltage comprises periodically charging a first capacitive element coupled
between a first node and a second node, the first
capacitive element having:
a first well region;
a second well region formed in the first well region; and
a transistor including source and drain regions formed
in the second well region and coupled to each other
and to the second node and a gate region formed over
the second well region, wherein the first well region
and the gate region are coupled to each other and to
the first node.

15. The method of claim 14, further comprising:
generating, at a node, the node voltage; and
in response to the second clock signal, periodically coupling the level shift node to the node.

16. The method of claim 14, further comprising, in
response to the second clock signal, periodically charging a
second capacitive element coupled between the level shift
node and a reference node to a level shift voltage substantially equal to the node voltage.

17. The method of claim 14, further comprising, in
response to the second clock signal, periodically coupling
the output node to a reference node.

18. The method of claim 14, further comprising:
coupling the level shift node to a supply node when a level
shift voltage at the level shift node is less than the
supply voltage at the supply node; and
decoupling the level shift node from the supply node
when the level shift voltage increases to greater than
the supply voltage.

19. The method of claim 14, further comprising:
charging a second capacitive element to a load voltage
substantially equal to the node voltage; and
driving a load at the load voltage.

* * * * *